United States Patent [19]

Rosen et al.

[11] 3,913,040

[45] Oct. 14, 1975

[54] MICROSTRIP CARRIER FOR HIGH FREQUENCY SEMICONDUCTOR DEVICES

[75] Inventors: Arye Rosen, Cherry Hill, N.J.; James Francis Reynolds, Beverly, Mass.

[73] Assignee: RCA Corporation, New York, N.Y.

[22] Filed: May 3, 1974

[21] Appl. No.: 466,724

[52] U.S. Cl. ................................ 333/84 M; 357/81

[51] Int. Cl.$^2$.. H01P 1/30; H01P 5/00; H01L 23/12

[58] Field of Search .................. 330/4.9; 331/107 G; 333/84 M; 357/74, 81

[56] References Cited

UNITED STATES PATENTS

| | | | |
|---|---|---|---|
| 3,200,296 | 8/1965 | Bruestle | 357/81 UX |
| 3,573,670 | 4/1971 | Skobern | 333/84 M X |
| 3,609,573 | 9/1971 | Hair | 357/81 UX |
| 3,708,732 | 1/1973 | Faust | 357/81 X |

*Primary Examiner*—Paul L. Gensler
*Attorney, Agent, or Firm*—Edward J. Norton; Joseph D. Lazar; Michael A. Lechter

[57] ABSTRACT

An L-shaped thermally conductive substrate is adapted to be mounted in a microwave stripline circuit structure. Two semiconductor elements are mounted on the substrate, one on each leg of the L-shaped structure. The semiconductor elements are electrically interconnected in such a manner as to reduce parasitic reactances to a minimum.

7 Claims, 5 Drawing Figures

MICROSTRIP CARRIER FOR HIGH FREQUENCY SEMICONDUCTOR DEVICES

BACKGROUND OF THE INVENTION

The present invention relates to a semiconductor device carrier for use in a microwave stripline circuit structure, and more particularly to a carrier which is substantially L-shaped in order to minimize the overlapping of heat spread of the semiconductor devices mounted thereon and to minimize the parasitic reactances normally associated with electrical interconnecting leads.

It is well known that excessive junction temperatures and parasitic reactances associated with electrical interconnecting leads will degrade the performance of semiconductor devices, especially at higher power and higher frequencies. The traditional solution to these problems is to place the semiconductor devices on a relatively large substrate having good thermal conductivity. If the semiconductors were appropriately spaced from one another, the substrate could efficiently carry away the heat generated by the devices since there would be only a minimal overlapping of heat spread. However, the further separated these devices are placed to minimize overlapping heat spread the longer the interconnecting leads must be, which in turn causes a marked increase in parasitic reactances at higher frequencies.

An alternate design method involves grouping the semiconductor devices in close proximity to one another on a relatively large substrate with good heat conductivity. Although this close grouping tends to minimize the parasitic reactances associated with the interconnecting leads, the heat spreads from each device begin to overlap substantially, thereby reducing the amount of heat which is conducted away from each device. Consequently, previous designs were forced to trade off efficient heat sinking against the minimization of parasitic reactances associated with interconnecting leads.

SUMMARY OF THE INVENTION

A semiconductor device carrier includes a substantially L-shaped thermally conductive substrate. Two semiconductor elements are mounted on the substrate, one semiconductor element being mounted on each leg of the L-shaped structure.

DETAILED DESCRIPTION

Figure 1:
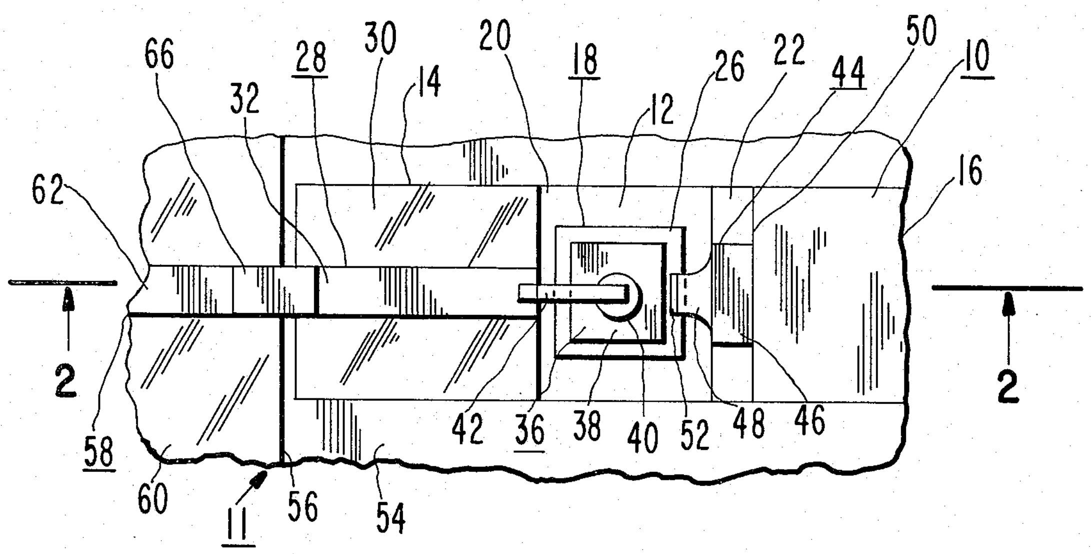
FIG. 1 is a top plan view of a form of the semiconductor device carrier of the present invention.
Figure 2:
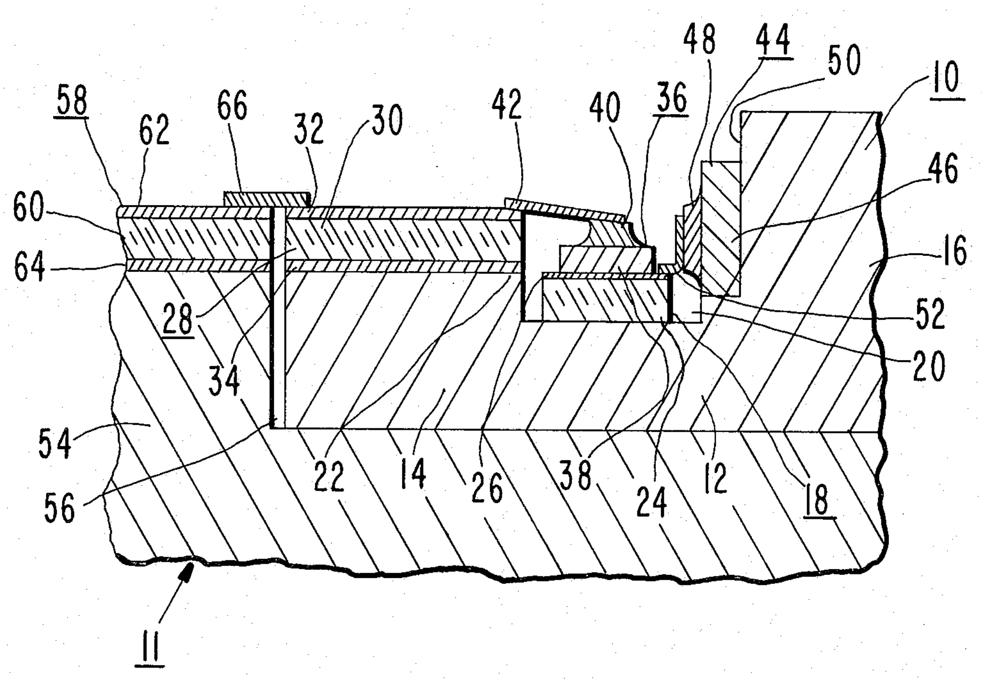
FIG. 2 is a sectional view taken along line 2—2 of FIG. 1.

Referring to FIGS. 1 and 2 of the drawing there is shown a semiconductor device carrier generally designated as 10, mounted on a microwave stripline circuit structure, generally designated as 11. The semiconductor device carrier 10 comprises a substrate 12 of an electrically and thermally conductive metal such as copper. The substrate 12 is substantially L-shaped, having a horizontal leg 14 and a vertical leg 16.

A standoff 18 is mounted in a recess 20 in the upper surface 22 of the substrate horizontal leg 14. The standoff comprises a flat layer 24 (see FIG. 2) of a dielectric material having good thermal conductivity, such as beryllium oxide, and a metal film 26 coated on the upper surface of the dielectric layer 24.

A transmission line segment 28, forming a part of a common input and output means, is mounted on the upper surface 22 of the substrate horizontal leg 14 adjacent to the recess 20. The transmission line segment 28 comprises a flat plate 30 of a material having good dielectric properties, such as a ceramic, and metal layers 32 and 34 (see FIG. 2) coated on the opposed flat surfaces of the plate 30. The metal layers 32 and 34 may be any suitable thin or thick film layer. The transmission line segment 28 is mounted on the substrate 12 with the metal layer 34 electrically and mechanically connected, such as by soldering or brazing, to the upper surface 22 of the substrate horizontal leg 14.

A first diode 36 having an anode electrode 38 and a cathode electrode 40 is mounted on the standoff 18. The anode electrode 38 is electrically and mechanically connected, such as by soldering or brazing, to the metal layer 26 of the standoff 18. The cathode electrode 40 is electrically connected to the metal layer 32 of the transmission line segment 28 through a first metal strip 42.

A second diode 44, having an anode electrode 46 and a cathode electrode 48, is mounted on the inner surface 50 of the vertical leg 16 of the substrate 12. The anode electrode 46 is electrically and mechanically connected, such as by soldering or brazing, to the inner surface 50. The cathode electrode 48 is electrically connected to the metal layer 26 of the standoff 18 through a second metal strip 52. Since the anode electrode 38 of the first diode 36 is also electrically connected to the metal layer 26, the first diode 36 is electrically connected in series with the second diode 44.

The microwave stripline circuit structure 11 comprises a metal plate 54 having a notch 56 in the top surface thereof. A circuit portion 58 is mounted on the top surface of the plate 54 adjacent to the notch 56. The circuit portion 58 comprises a flat plate 60 of an electrical insulating material, such as a ceramic, coated on its opposed flat surfaces with metal layers 62 and 64 (see FIG. 2). The metal layer 64 is bonded, such as by soldering or brazing, to the metal plate 54.

The semiconductor device carrier 10 is mounted in the notch 56 in the stripline circuit structure plate 54 with the transmission line segment 28 being adjacent to but slightly spaced from the circuit portion 58. The notch 56 is cut to a depth such that the metal layer 62 on the circuit portion 58 is substantially coplanar with the metal layer 32 of the transmission line segment 28. A metal connecting strip 66, forming a part of the common input and output means, extends across the gap between the circuit portion 58 and the transmission line segment 28 and is bonded at its ends to the metal layers 62 and 32.

In the stripline circuit structure 11, the metal plate 54 serves as a ground plane and the metal layer 62 of the circuit portion 66 as a common input and output line. Since the substrate 12 of the semiconductor device carrier 10 is mounted directly on the plate 54 and the anode electrode 46 of the second diode 44 is electrically connected to the substrate 14, the anode electrode 46 of the second diode 44 is electrically connected to ground. The input-output line 62 of the stripline circuit structure is connected to the cathode electrode 40 of the first diode 36 through the connecting strip 66, metal layer 32 of the transmission line segment 38 and the first metal strip 42. Since the anode electrode 38 of the first diode 36 is electrically connected to the cathode electrode 48 of the second diode 44 through the second metal strip 52, the first and second diodes 36 and 44 are electrically connected in series between the input-output line 62 and ground.

Although the semiconductor device carrier described herein shows that the diodes are series connected with the cathode electrode 40 of the first diode 36 electrically connected to the input-output line 62 and the anode electrode 46 of the second diode 44 electrically connected to ground, it is understood that this configuration is for the purpose of example only. A configuration wherein the electrical connections to the electrode of the diodes are reversed, that is, the diodes are inverted with the cathode electrode of the first diode 44 electrically connected to the anode electrode 46 of the second diode 44 and the cathode electrode 48 of the second diode being grounded, is also within the scope and contemplation of the present invention.

The preferred embodiment of the carrier disclosed herein may be operated as either an oscillator or amplifier. When operated as an oscillator, a reverse bias signal is applied at the first metal strip 42 and consists of a pulsed or DC voltage having a magnitude which is sufficient to trigger the series connected diodes 36 and 44 into generating microwave energy in the TRAPATT mode of operation. The microwave energy thus generated is conducted to the transmission line segment 28 through the first metal strip 42. The transmission line segment 28 transmits the microwave energy to an external microwave stripline utilization circuit through the metal connecting strip 66 and the stripline circuit portion 58.

When operated as an amplifier, an external ferrite circulator (not shown) may be used to couple a microwave energy from an external source (not shown) to the series connected diodes 36 and 44. A microwave signal is applied to the series connected diodes 36 and 44 by way of the metal connecting strip 66, the transmission line segment 28, and the first metal strip 42. A pulsed or DC reverse bias voltage is applied at the first metal strip 42. However, the magnitude of the applied pulsed or DC voltage is not sufficient to trigger the diodes into the TRAPATT mode of operation. The applied microwave signal combines with the applied pulsed or DC reverse bias voltage and triggers the series connected diodes 36 and 44 into amplifying the applied microwave signal. The amplified signal is conducted to the transmission line segment 28 through the first metal strip 42. The transmission line segment 28 transmits the amplified microwave signal to the external ferrite circulator through the metal connecting strip 66, and the microwave stripline circuit portion 58.

Figures 3, 4, 5:
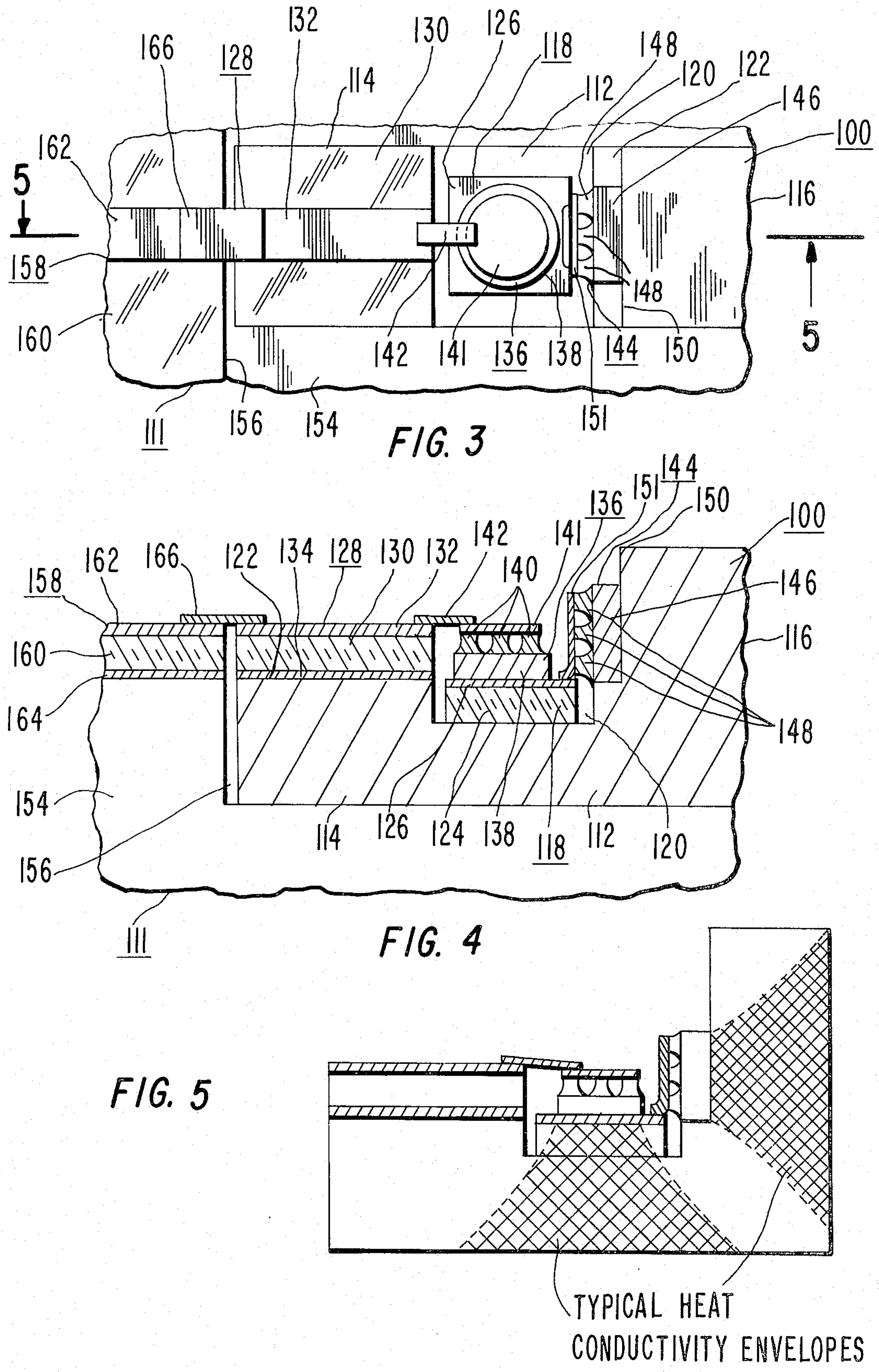
FIG. 3 is a top plan view of an alternate configuration of the semiconductor device carrier of the present invention.
FIG. 4 is a sectional view taken along line 5—5 of FIG. 3.
FIG. 5 depicts a typical representation of the heat spreads in the semiconductor device carrier of the present invention.

Although the semiconductor device carrier 10 is shown and has been described using the single diodes 36 and 44, the carrier may also be constructed and operated as shown in FIGS. 3 and 4 with each single diode being replaced by a diode array having a common electrode. For illustration purposes the FIGS. 4 and 5 show diode arrays which have a common anode electrode and individual cathode electrodes. However, it is to be noted that arrays which have a common cathode electrode and individual anode electrodes can also be used and are therefore also within the scope and contemplation of the present invention.

Referring to FIGS. 3 and 4 of the drawing, there is shown an alternate embodiment of a semiconductor device carrier generally designated as 100, mounted on a microwave stripline circuit structure, generally designated as 111. The first and second diodes 36 and 44 of the preferred embodiment (see FIGS. 1 and 2) are replaced by first and second diode arrays 136 and 144 respectively. Those structural elements of the alternate embodiment which are common to elements of the preferred embodiment have the same reference numbers preceded by a "1."

The first diode array, 136 having a common anode electrode 138 and a plurality of cathode electrodes 140 (see FIG. 4), is mounted on the standoff 118. The common anode electrode 138 is electrically and mechanically connected, such as by soldering or brazing, to the metal layer 126 of the standoff 118. An electrical interconnecting member comprises a flat metal disc 141 having good electrical conductivity, such as copper. The plurality of cathode electrodes 140 are electrically connected to the flat metal disc 141, which is in turn electrically connected to the metal layer 132 of the transmission line segment 128 through the first metal strip 142.

A second diode array 144, having a common anode electrode 146 and a plurality of cathode electrodes 148, is mounted on the inner surface 150 of the vertical leg 116 of the substrate 112. The common anode electrode 146 is electrically and mechanically connected, such as by soldering or brazing, to the inner surface 150. A second electrical interconnecting member comprises a second flat metal disc 151 having good electrical conductivity, such as copper. The plurality of cathode electrodes 148 are electrically connected to the second flat metal disc 151, which is in turn electrically connected, such as by soldering, directly to the metal layer 126 of the standoff 118. Since the common anode electrode 138 at the first diode array 136 is also electrically connected to the metal layer 126, the first diode array 136 is electrically connected in series with the second diode array 144.

Although the alternate preferred embodiment of the semiconductor device carrier described herein indicates that the diode arrays are series connected with the cathode electrodes 140 of the first diode array 136 electrically connected to the input-output line 162 and the common anode electrode 146 of the second diode array 144 electrically connected to ground, it is understood that this configuration is for the purpose of example only. A configuration wherein the electrical connections to the electrodes of the diode arrays are reversed, that is, the diode arrays are inverted with a common cathode electrode of the first diode 144 being electrically connected to a plurality of anode electrodes of the second diode array 144 and a common cathode electrode of the second diode array being grounded, is also within the scope and contemplation of the present invention.

As indicated in the detailed description of the preferred embodiment of the semiconductor device carrier, the alternate embodiment of the semiconductor device carrier may also be operated either as an oscillator or an amplifier, the methods of operation being the same for both the preferred and alternate embodiments.

The principal advantages of the invention disclosed herein are the significant improvement of heat conduction away from the semiconductor devices while simultaneously minimizing the parasitic reactances associated with electrical interconnecting leads. The L-shaped structure enables heat to be conducted away from the semiconductor devices without any significant overlap of the resulting heat spreads. FIG. 5 shows typical heat conductivity envelopes in the L-shaped structure of the invention. As shown in FIG. 5, the envelopes have considerable room for expansion before any interference of the heat spreads would be encountered. The improved heat conductivity characteristic of the invention permits operation of the microwave semiconductor devices at longer duty cycles which increases the average power output of the mounted semiconductor devices. As also shown in FIG. 5, the length of the electrical interconnection leads are minimized since the semiconductor elements are located adjacent to each other. Since lead inductance is the primary source of parasitic reactances at higher frequencies, minimizing the length of the electrical interconnecting leads will reduce these parasitic reactances to a minimum.

We claim:

1. A semiconductor device carrier comprising:

a thermally conductive substrate, said substrate being substantially L-shaped having a pair of legs with intersecting inner surfaces;

first and second semiconductor elements each element having two terminals, said first and second semiconductor elements generating heat when activated;

said first and second semiconductor elements being mounted on the inner surface of the respective legs adjacent the intersection of said inner surfaces and so arranged that a selected terminal of said first semiconductor elements is physically proximate to a selected terminal of said second semiconductor elements, said substrate being a heat sink for said heat generated by said elements conducting said heat away from said first semiconductor element in a first heat conductivity envelope defining a first portion of said substrate and away from said second semiconductor element in a second heat conductivity envelope defining a second portion of said substrate; and a short, direct electrical connection between said selected terminal of said first element and said selected terminal of said second element;

whereby the respective heat conductivity envelopes do not substantially overlap and parasitic reactances associated with said electrical connection are substantially minimized.

2. A semiconductor device carrier in accordance with claim 1 in which said substrate is electrically conductive and one of said semiconductor elements is mounted on a standoff, said standoff comprising a thermally conductive dielectric platform member having a lower surface which is bonded to the inner surface of one leg of said substrate adjacent the intersection and an upper surface having a metal layer coated thereon to which said first semiconductor element is mechanically and electrically connected.

3. A semiconductor device carrier comprising:

an electrically and thermally conductive substrate, said substrate being substantially L-shaped having a pair of legs with intersecting inner surfaces;

a thermally conductive dielectric platform member having a lower surface bonded to the inner surface of one leg of said substrate adjacent to the intersection of inner surfaces and an upper surface having a metal layer coated thereon;

first and second semiconductor elements, said first semiconductor element being mechanically and electrically connected to said upper surface of said dielectric platform member, and said second semiconductor element being mounted on the inner surface of the other leg of said substrate adjacent to the intersection of inner surfaces; and common input/output means, said common input/output means including a transmission line segment mounted directly on the inner surface of said one leg adjacent the standoff away from the intersection, said transmission line segment including a metal layer and a dielectric member spacing the metal layer from said substrate.

4. A semiconductor device carrier in accordance with claim 3 in which each of said semiconductor elements comprises a diode having an anode electrode and a cathode electrode, said diodes being adapted to operate at microwave frequencies.

5. A semiconductor device carrier in accordance with claim 4 in which said diodes are electrically connected in series, the anode electrode of one diode being electrically connected to the cathode electrode of the other diode through the metal layer of said dielectric platform member.

6. A semiconductor device carrier in accordance with claim 5 in which said series connected diodes are electrically connected between the metal layer of said transmission line segment and the substrate.

7. A semiconductor device carrier in accordance with claim 6 having a means whereby a reverse signal can be applied across the electrodes of said diodes.

* * * * *